United States Patent [19]
Suzuki

[11] Patent Number: 5,952,857
[45] Date of Patent: Sep. 14, 1999

[54] SEMICONDUCTOR INTEGRATED CIRCUIT ACHIEVING RELIABLE DATA LATCHING

[75] Inventor: Takaaki Suzuki, Kawasaki, Japan

[73] Assignee: Fujitsu Limited, Kanagawa, Japan

[21] Appl. No.: 09/063,439

[22] Filed: Apr. 21, 1998

[30] Foreign Application Priority Data

Oct. 20, 1997 [JP] Japan ..................... 9-287343

[51] Int. Cl.[6] ............... H03K 5/00; H03K 5/13
[52] U.S. Cl. ............. 327/149; 327/158; 375/376
[58] Field of Search .................. 327/141, 144, 327/145, 147, 149, 150, 153, 156, 157, 158, 159, 161; 375/355, 376; 395/551, 552; 331/1 A, 25

[56] References Cited

U.S. PATENT DOCUMENTS 5,150,068  9/1992  Kawashima et al. ............... 327/145
5,486,783  1/1996  Baumert et al. .................... 327/147
5,663,668  9/1997  Hayashi et al. .................... 327/156

*Primary Examiner*—Tuan T. Lam
*Attorney, Agent, or Firm*—Nikaido Marmelstein Murray Oram LLP

[57] ABSTRACT

A semiconductor integrated circuit receiving a plurality of input signals each exhibiting a signal-level change during a predetermined time span includes a timing-detection circuit which detects timing of said signal-level change of said input signals, and detects which input signal is furthest behind in terms of a signal-level-change timing among said plurality of input signals within said predetermined time span. The semiconductor integrated circuit further includes first delay-adjustment circuits which delay said plurality of input signals, respectively, in response to an output signal from the timing-detection circuit to generate delayed input signals such that signal-level-change timings of said delayed input signals are aligned to said signal-level-change timing of said furthest behind input signal, and latch circuits each latching a respective one of said delayed input signals at the same timing.

12 Claims, 9 Drawing Sheets

SEMICONDUCTOR INTEGRATED CIRCUIT ACHIEVING RELIABLE DATA LATCHING

BACKGROUND OF THE INVENTION

1. Field of the Invention

The present invention generally relates to semiconductor integrated circuits, and particularly relates to a semiconductor integrated circuit which latches input signals in synchronism with a clock signal.

2. Description of the Related Art

Semiconductor devices operating in synchronism with a clock signal receives a clock signal CLK as an input thereto, and uses this clock signal CLK for receiving other clock signals. In order to insure reliable data reading at rising edges of the clock signal CLK, data must become valid at least a setup time Ts before a given rising edge, and must be maintained at least for a duration of a hold time Th after the given rising edge. Required lengths of the setup time Ts and the hold time Th are generally specified in catalogs. Users need to make sure that the clock signal CLK and other signals are supplied to a semiconductor device so as to satisfy the setup time Ts and the hold time Th specified in the catalog.

When a clock cycle is 10 ns and the setup time Ts and the hold time Th are respectively 3 ns, for example, a data signal must maintain a valid value thereof during a 6-ns period centering at a given rising edge of the clock signal CLK.

In order to enhance operation speed of the semiconductor devices, a frequency of the clock signal CLK needs to be increased to boost data-input/output speed. When the clock cycle is shortened to 5 ns in comparison to the above example, however, the setup time Ts and the hold time Th proportionately become 1.5 ns, respectively. In this case, users are required to match a data-valid period with a 3-ns period of the setup time Ts and the hold time Th in terms of their temporal positions. In other words, the data signal must complete a signal-level change thereof within a 2-ns period output of the one clock cycle of 5 ns.

In this manner, as the frequency of the clock signal CLK is increased, an increased accuracy is required to the users with regard to timings of data supply. This results in more difficulties in system design and implementation.

In consideration of this, it is preferable to allow users to enjoy looser data-supply timings rather than requiring the users to comply with strict conditions of the setup time Ts and the hold time Th. When a clock cycle is 5 ns, for example, the loosest conditions for the users are achieved if data changes are allowed to take place within a 5-ns period which is the same as the clock cycle. Namely, if a semiconductor device is designed to latch data after a signal-level change thereof while allowing such a signal-level change to occur at any timing during a given one clock cycle, users are only required to position a data-change timing within one clock cycle, thereby making it easier to implement a system.

Accordingly, there is a need for a semiconductor integrated circuit which allows input-data changes to take place within a period of one clock cycle, and latches the input data after the signal changes thereof.

SUMMARY OF THE INVENTION

Accordingly, it is a general object of the present invention to provide a semiconductor integrated circuit which can satisfy the need described above.

It is another and more specific object of the present invention to provide a semiconductor integrated circuit which allows input-data changes to take place within a period of one clock cycle, and latches the input data after the signal changes thereof.

In order to achieve the above objects according to the present invention, a semiconductor integrated circuit receiving a plurality of input signals each exhibiting a signal-level change during a predetermined time span includes a timing-detection circuit which detects timing of said signal-level change of said input signals, and detects which input signal is furthest behind in terms of a signal-level-change timing among said plurality of input signals within said predetermined time span. The semiconductor integrated circuit further includes first delay-adjustment circuits which delay said plurality of input signals, respectively, in response to an output signal from the timing-detection circuit to generate delayed input signals such that signal-level-change timings of said delayed input signals are aligned to said signal-level-change timing of said furthest behind input signal, and latch circuits each latching a respective one of said delayed input signals at the same timing.

In the semiconductor integrated circuit described above, the input signals are allowed to have respective signal-level changes within the predetermined time span. The semiconductor integrated circuit aligns all the input signals to the input signal which is furthest behind among the input signals in terms of timings thereof, and uses latches to latch the aligned input signals. This configuration achieves reliable data latching which latches input data after signal-level changes thereof when these input data exhibits signal-level changes during the predetermined time span.

According to one aspect of the present invention, data latching is performed by using a clock signal which is delayed by a predetermined delay time behind the signal-change timing of the furthest-behind input signal. This achieves reliable data latching which insures an appropriate setup time and hold time.

According to another aspect of the present invention, reliable signal alignment is achieved by using a feedback-loop phase adjustment.

According to another aspect of the present invention, the delays of the input signals and the clock signal are adjusted during a calibration mode, and the adjusted delays are used for reliable data latching during a subsequent normal operation mode.

According to another aspect of the present invention, the calibration mode may be set in response to a command input.

According to another aspect of the present invention, the calibration mode may be set in response to the power-on of the semiconductor integrated circuit.

According to another aspect of the present invention, the calibration mode is automatically set when there is a change in a power voltage or temperature.

According to another aspect of the present invention, when the calibration mode is automatically set in response to a power-voltage change or a temperature change, the calibration mode is brought to an end after delay adjustment is performed a predetermined number of times.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
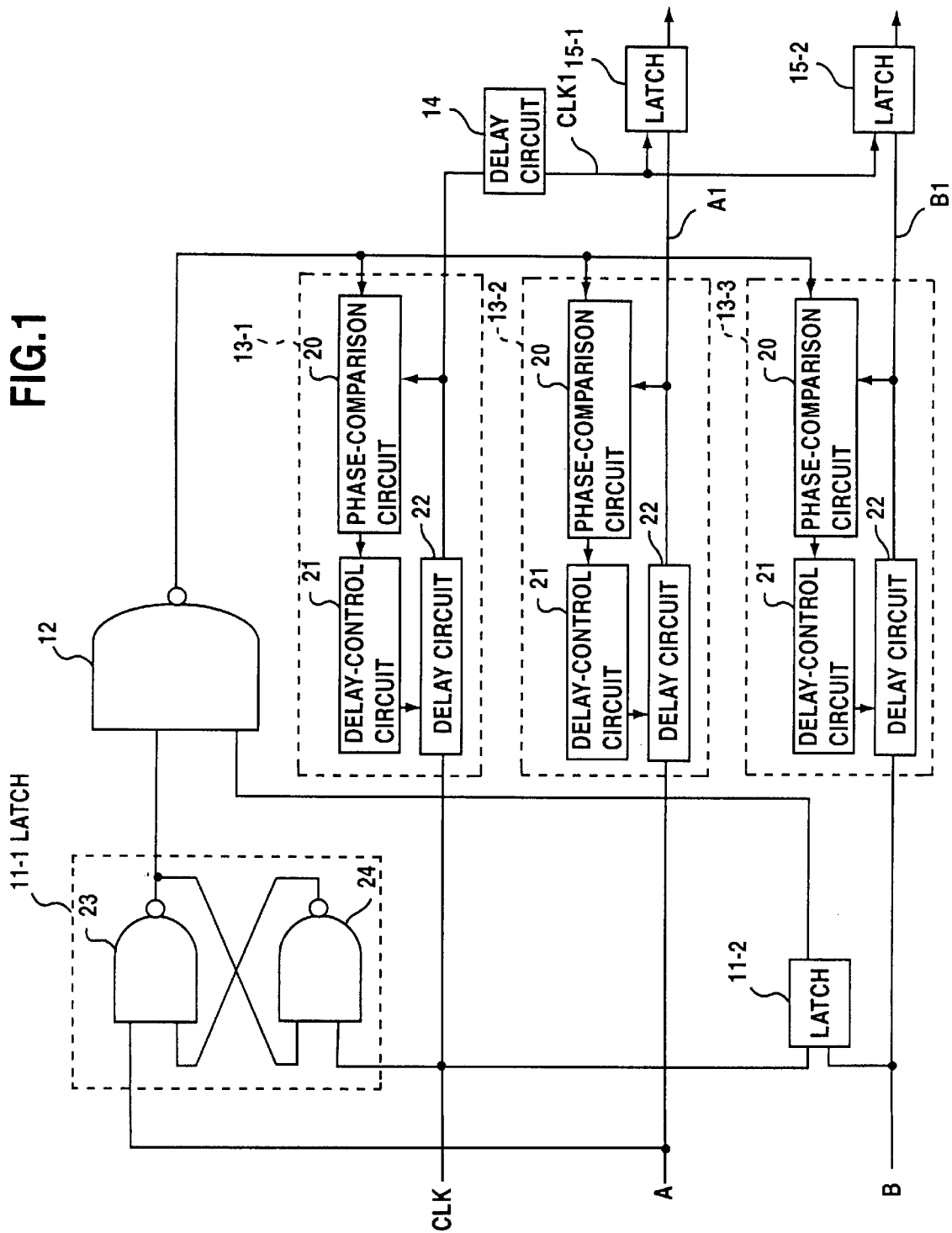
FIG. 1 is a block diagram of a signal-input circuit according to a first embodiment of the present invention.

FIG. 1 is a block diagram of a signal-input circuit according to a first embodiment of the present invention.

The signal-input circuit of FIG. 1 includes latches 11-1 and 11-2, a NAND circuit 12, DLL circuits 13-1 through 13-3, a delay circuit 14, and latches 15-1 and 15-2. Each of the DLL circuits 13-1 through 13-3 is a delay-adjustment circuit for adjusting a signal delay, and includes a phase-comparison circuit 20, a delay-control circuit 21, and a delay circuit 22. Each of the latches 11-1 and 11-2 includes NAND circuits 23 and 24.

In the signal-input circuit of FIG. 1, the latches 11-1 and 11-2 are reset at a falling edge of the clock signal CLK, so that outputs of the latches 11-1 and 11-2 are set to LOW. After the reset, the latch 11-1 is set at a falling edge of an input signal A so as to produce a HIGH output. Also, the latch 11-2 is set at a falling edge of an input signal B so as to produce a HIGH output. The outputs of the latches 11-1 and 11-2 are supplied to the NAND circuit 12. The NAND circuit 12 thus outputs a LOW-level signal at a timing when both the latch 11-1 and the latch 11-2 are set. Namely, the timing at which the output of the NAND circuit 12 is changed from HIGH to LOW indicates a signal-change timing with respect to a signal having the largest delay among the input signal A and the input signal B.

In this manner, the latches 11-1 and 11-2 and the NAND circuit 12 together form a timing-detection circuit which detects a signal-change timing of the most delayed signal.

In FIG. 1, the number of input signals is two, but may be any number n which is larger than two. In this case, a falling edge of an output from the NAND circuit 12, which has n inputs thereto, indicates a signal-change timing of a signal having the largest delay among the n input signals.

The output of the NAND circuit 12 is supplied to the DLL circuits 13-1 through 13-3. The DLL circuit 13-1 further receives the clock signal CLK, and delays the clock signal CLK for phase adjustment such that rising edges of the clock signal CLK coincide with falling edges of the output of the NAND circuit 12. The DLL circuit 13-2 receives the input signal A, and delays the input signal A for phase adjustment such that falling edges of the input signal A are concurrent with falling edges of the output of the NAND circuit 12. Further, the DLL circuit 13-3 receives the input signal B, and delays the input signal B for phase adjustment such that falling edges of the input signal B are concurrent with falling edges of the output of the NAND circuit 12.

The DLL circuits 13-1 through 13-3 have different circuit configurations depending on what combination of a falling edge and a rising edge is subjected to the phase comparison. As will be described later, however, those circuit structures are almost identical, so that each of the DLL circuits 13-1 through 13-3 is shown as having the same circuit elements, i.e., the phase-comparison circuit 20, the delay-control circuit 21, and the delay circuit 22, for the sake of simplicity of explanation.

The clock signal CLK having a phase thereof adjusted by the DLL circuit 13-1 is supplied as a delayed clock signal CLK1 to the latches 15-1 and 15-2 via the delay circuit 14. The input signals A and B having phases thereof adjusted by the DLL circuits 13-2 and 13-3, respectively, are supplied to the latches 15-1 and 15-2 as delayed input signals A1 and B1, respectively.

The phase-adjusted clock signal CLK output from the DLL circuit 13-1 is in synchronism with the signal having the largest delay among the input signals A and B. Further, the delayed input signals A1 and B1, which are obtained by adjusting phases of the input signals A and B, are also in synchronism with the signal having the largest delay among the input signals A and B. The phase-adjusted clock signal CLK is then delayed by a predetermined setup time Ts by the delay circuit 14, and is supplied as the delayed clock signal CLK1 to the latches 15-1 and 15-2. Accordingly, the latches 15-1 and 15-2 can achieve reliable latching of all the input signals by using the delayed clock signal CLK1 as a synchronization signal.

The above-described operations are performed during a calibration mode in a semiconductor device provided with the signal-input circuit of FIG. 1. Namely, phase delays of the DLL circuits 13-1 through 13-3 are adjusted to appropriate delays in the calibration mode, so that input signals are reliably latched in a normal operation mode after the completion of the calibration mode. Data latched by the latches 15-1 and 15-2 are then supplied to internal circuits of the semiconductor device.

FIGS. 2A through 2F are timing charts for explaining the operations of the signal-input circuit shown in FIG. 1.

Figure 2:
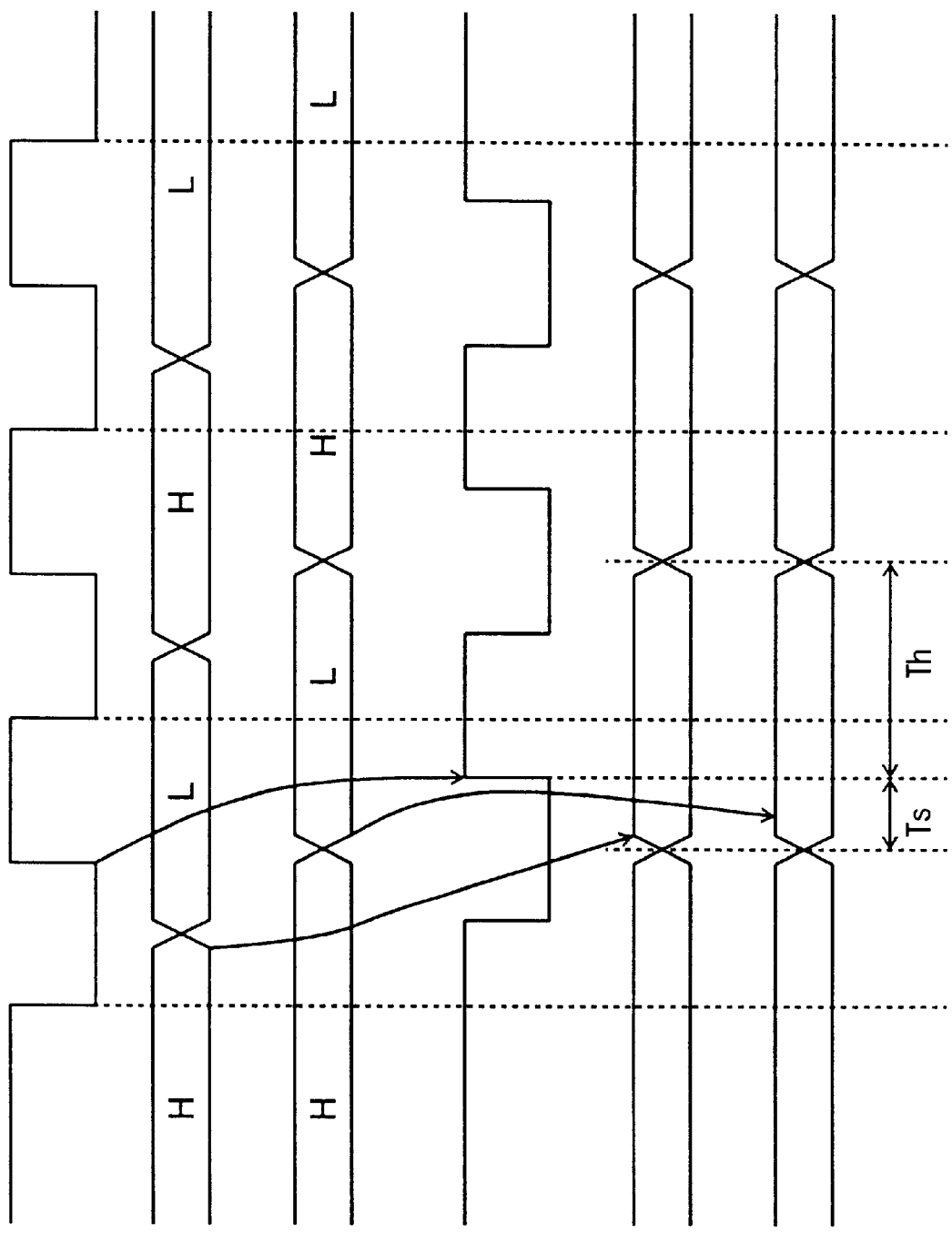
FIGS. 2A through 2F are timing charts for explaining operations of the signal-input circuit shown in FIG. 1.

As shown in FIGS. 2A through 2C, the input signals A and B have a level change thereof within one clock cycle during which the clock signal CLK changes from LOW to HIGH. The input signals A and B are supplied to the signal-input circuit at different timings because of various causes such as different lengths of signal wires, different capacitances of signal wires, different characteristics of circuits on the signal-output side, etc.

The signal-input circuit adjusts phases of the input signals A and B by using the DLL circuits 13-2 and 13-3, respectively, and generates the delayed input signals A1 and B1, which exhibit a timing match with the input signal having the largest delay as shown in FIGS. 2E and 2F. Further, the DLL circuit 13-1 and the delay circuit 14 are used to generate the delayed clock signal CLK1, which is delayed by the setup time Ts behind the timing of the input signal having the largest delay. The delayed clock signal CLK1 is then used for latching the delayed input signals A1 and B1. In this manner, the delayed input signal A1 and B1 can be latched while maintaining an appropriate setup time Ts and an appropriate hold time Th by using the delay circuit 14.

In this manner, the signal-input circuit of FIG. 1 can align input signals with the timing of the most delayed input signal, and uses the delayed clock signal having a delay equal to the setup time Ts in comparison to the most delayed signal to latch the input signals. In this configuration, even when the input signals change at different timings, a predetermined setup time Ts and a predetermined hold time Th can be secured as long as the input-signal changes are limited within one clock cycle of the clock signal CLK. This achieves reliable latching of the input signals.

Figure 3:
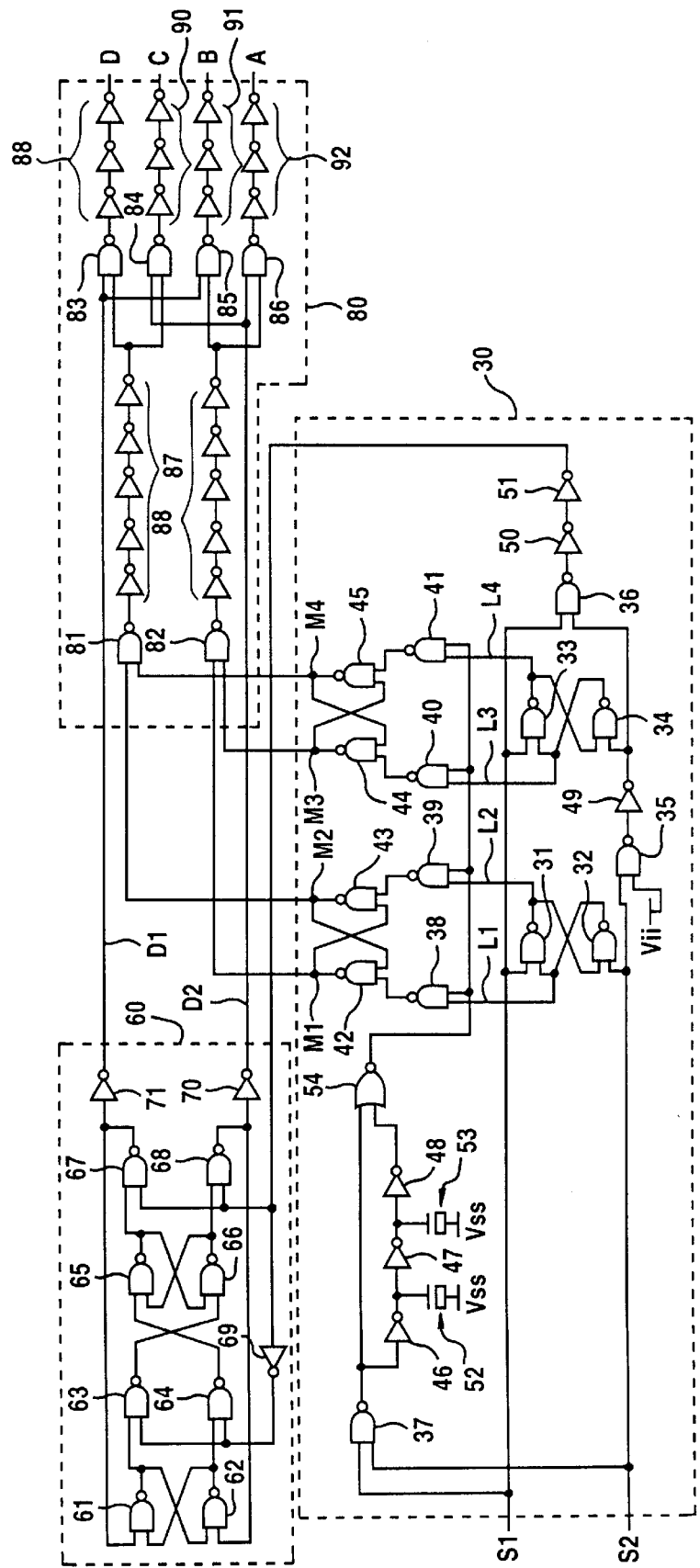
FIG. 3 is a circuit diagram showing a circuit configuration of a phase-comparison circuit.

FIG. 3 is a circuit diagram showing a circuit configuration of the phase-comparison circuit 20.

The phase-comparison circuit 20 of FIG. 3 includes an edge-timing-comparison circuit 30, a binary counter 60, and a pulse-generation circuit 80.

The edge-timing-comparison circuit 30 includes NAND circuits 31 through 45, inverters 46 through 51, capacitors 52 and 53, and a NOR circuit 54. The binary counter 60 includes NAND circuits 61 through 68 and inverters 69 through 71. The pulse-generation circuit 80 includes NAND circuits 81 through 86 and a plurality of inverters 87 through 92.

The edge-timing-comparison circuit 30 receives input signals S1 and S2, and determines which one of the input signals S1 and S2 has a rising edge ahead of the other. When a temporal order of falling edges needs to be determined, the input signals S1 and S2 are inverted by inverters, and are input to the edge-timing-comparison circuit 30. When a rising edge and a falling edge are compared in terms of edge timings, one of the input signals S1 and S2 is inverted before being input to the edge-timing-comparison circuit 30 of FIG. 3. In FIG. 3, one of the input signals S1 and S2 corresponds to an output of the NAND circuit 12 shown in FIG. 1, and the other corresponds to the clock signal CLK, the input signal A, or the input signal B.

If a rising edge of the input signal S1 is ahead of a rising edge of the input signal S2, a latch comprised of the NAND circuits 31 and 32 produces outputs L1 and L2 which are HIGH and LOW, respectively. Also, a latch formed by the NAND circuits 33 and 34 generates output L3 and L4 which are HIGH and LOW, respectively.

After this, both of the input signals S1 and S2 become HIGH, which changes an output of the NAND circuit 37 to LOW. This prompts the NOR circuit 54 to produce a HIGH output for a predetermined period of time. The HIGH output of the NOR circuit 54 opens gates of the NAND circuits 38 through 41, so that the latch outputs L1 through L4 are inverted and input to two latches comprised of NAND circuits 42 through 45. The latch comprised of NAND circuits 42 and 43 thus has outputs M1 and M2 which are HIGH and LOW, respectively, as are the latch outputs L1 and L2. Also, the latch comprised of NAND circuits 44 and 45 has outputs M1 and M2 which are HIGH and LOW, respectively, as are the latch outputs L3 and L4.

In this manner, when the input signal S1 has a rising edge ahead in time, the NAND circuit 82 of the pulse-generation circuit 80 changes an output thereof to LOW.

When a rising edge of the input signal S2 is ahead of a rising edge of the input signal S1 by a sufficient margin, the latch outputs M1 and M2 become LOW and HIGH, respectively, and, also, the latch outputs M3 and M4 become LOW and HIGH, respectively. In this case, therefore, the NAND circuit B1 of the pulse-generation circuit 80 changes an output thereof to LOW.

When a rising edge of the input signal S2 is ahead of a rising edge of the input signal S1 only by a small margin, the latch comprised of the NAND circuits 33 and 34 produces the outputs L3 and L4 which are HIGH and LOW, respectively, because of a signal delay introduced by the NAND circuit 35 and the inverter 49. In this case, the latch outputs M1 and M2 are LOW and HIGH, respectively, whereas the latch outputs M3 and M4 are HIGH and LOW, respectively. The NAND circuits 81 and 82 of the pulse-generation circuit 80 thus do not change outputs thereof, and these outputs remain at the HIGH level.

In this manner, when a difference in rising-edge timings is small between the input signal S1 and the input signal S2, i.e., when the rising edges can be regarded as having the same timing, the phase-comparison circuit 20 of FIG. 3 does not generate an output.

The binary counter 60 divides a frequency of a signal by half when receiving the signal from the NAND circuit 36 of the edge-timing-comparison circuit 30. The binary counter 60 outputs a frequency-divided signal D1 from the inverter 71, and outputs a frequency-divided signal D2 from the inverter 70. The signal from the NAND circuit 36 has the same cycle as the input signals S1 and S2. Because of this, the frequency-divided signal D1 output from the binary counter 60 becomes HIGH during even-number cycles of the input signals, for example. In this case, the frequency-divided signal D2 becomes HIGH during odd-number cycles.

In the pulse-generation circuit 80, the output of the NAND circuit 82 becomes LOW when the input signal S1 is ahead of the input signal S2, as previously described. On the other hand, when the input signal S2 is ahead in time by a sufficient margin, the output of the NAND circuit 81 becomes LOW.

When the input signal S1 is ahead in time, the output of the NAND circuit 82 is inverted by the plurality of inverters 88, and is supplied to the NAND circuit 85 and 86 as a HIGH signal. The NAND circuit 85 further receives the frequency-divided signal D1, and the NAND circuit 86 further receives the frequency-divided signal D2. In this case, therefore, the pulse-generation circuit 80 generates HIGH pulses which are output as a signal A and a signal B in turn.

When the input signal S2 is ahead in time, the output of the NAND circuit 81 is inverted by the plurality of inverters 87, and is supplied to the NAND circuit 83 and 84 as a HIGH signal. The NAND circuit 83 further receives the frequency-divided signal D1, and the NAND circuit 84 further receives the frequency-divided signal D2. In this case, therefore, the pulse-generation circuit 80 generates HIGH pulses which are output as a signal C and a signal D in turn.

Figure 4:
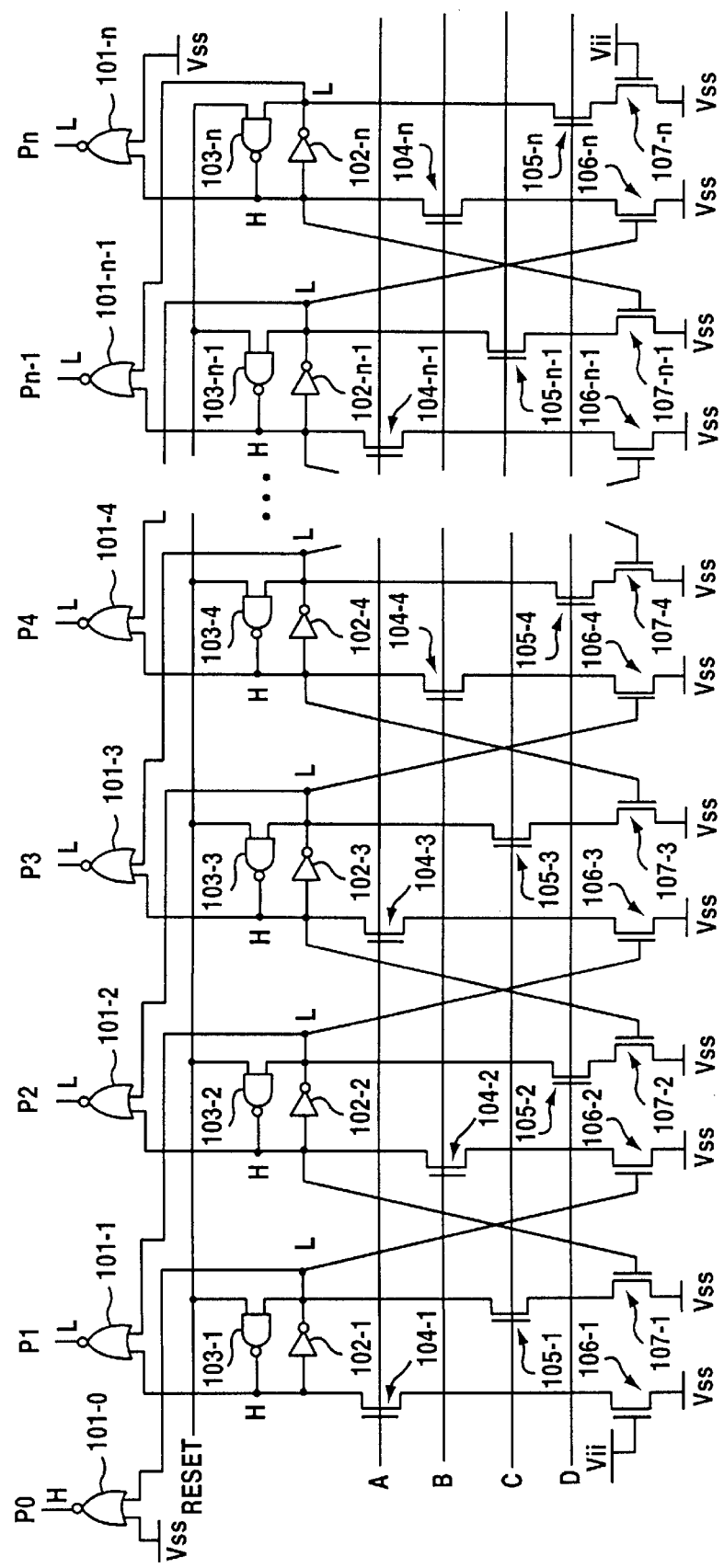
FIG. 4 is a circuit diagram of a delay-control circuit.

FIG. 4 is a circuit diagram of the delay-control circuit 21.

The delay-control circuit 21 includes NOR circuits 101-0 through 101-n, inverters 102-1 through 102-n, NAND circuits 103-1 through 103-n, NMOS transistors 104-1 through 104-n, NMOS transistors 105-1 through 105-n, NMOS transistors 106-1 through 106-n, and NMOS transistors 107-1 through 107-n. When a reset signal RESET is turned to LOW, the delay-control circuit 21 is reset. Namely, when the reset signal RESET becomes LOW, outputs of the NAND circuits 103-1 through 103-n become HIGH, and outputs of the inverters 102-1 through 102-n become LOW. A pair of a given one of the NAND circuits 103-1 through 103-n and a corresponding one of the inverters 102-1 through 102-n forms a latch in which one element of the pair receives an output of the other element as an input. An initial state created by the reset signal RESET is thus kept even after the reset signal RESET returns to HIGH.

In this initial state, an output P0 of the NOR circuit 101-0 is HIGH as shown in FIG. 4, and the remaining NOR circuits 101-1 through 101-n have outputs P1 through Pn, respectively, which are LOW. That is, only the output P0 is HIGH among the outputs P0 through Pn.

When there is a need to increase the amount of delay with respect to a signal subjected to phase adjustment, HIGH pulses are supplied to signal lines A and B in turn. With a HIGH pulse supplied to the signal line A, the NMOS transistor 104-1 is turned on. Since the NMOS transistor 106-1 is in a turned-on state, an output of the NAND circuit 103-1 is connected to the ground, and is forced to change from HIGH to LOW, so that an output of the inverter 102-1 becomes HIGH. This condition is latched by the latch comprising the NAND circuit 103-1 and the inverter 102-1. As a result, the output P0 is changed from HIGH to LOW, while the output P1 is turned from LOW to HIGH. In this condition, therefore, only the output P1 is HIGH.

With a HIGH pulse supplied to the signal line B, the NMOS transistor 104-2 is turned on. Since the NMOS transistor 106-2 is already in a turned-on state, an output of the NAND circuit 103-2 is connected to the ground, and is forced to change from HIGH to LOW, so that an output of the inverter 102-2 becomes HIGH. This condition is latched by the latch comprising the NAND circuit 103-2 and the inverter 102-2. As a result, the output P1 is changed from HIGH to LOW, while the output P2 is turned from LOW to HIGH. In this condition, therefore, only the output P2 is HIGH.

As described above, HIGH pulses are supplied to the right one by one when this position marks the only one HIGH output among the outputs P0 through Pn.

When there is a need to decrease the delay amount, HIGH pulses are supplied to signal lines C and D in turn. Operations in this case are simply a reverse of the above-described operations, and a description thereof will be omitted.

When the HIGH pulses are supplied to the signal lines C and D in turn, the only one HIGH output among the outputs P0 through Pn shifts a position thereof to the left one by one.

The output signals P0 through Pn are supplied to the delay circuit 22 so as to adjust a delay of the signal subjected to phase adjustment.

Figure 5:
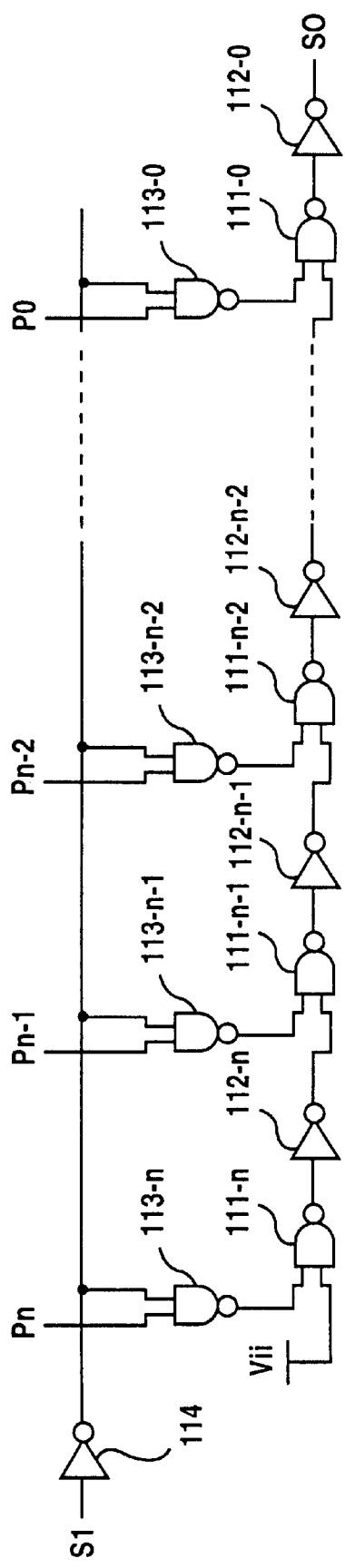
FIG. 5 is a circuit diagram showing a circuit structure of a delay circuit shown in FIG. 1.

FIG. 5 is a circuit diagram showing a circuit structure of the delay circuit 22 shown in FIG. 1.

The delay circuit 22 of FIG. 5 includes NAND circuits 111-0 through 111-n, inverters 112-0 through 112-n, NAND circuits 113-0 through 113-n, and an inverter 114. The NAND circuits 113-0 through 113-n have one input thereof receiving the outputs P0 through Pn from the delay-control circuit 21, respectively, and have the other input thereof receiving an inverse of an input signal SI from the inverter 114. This input signal SI is the signal which is subjected to the phase adjustment.

Since only one of the outputs P0 through Pn is HIGH, only one of the NAND circuits 113-0 through 113-n which receives this HIGH signal allows the input signal SI to pass therethrough. The remaining ones of the NAND circuits 113-0 through 113-n produce HIGH outputs all the time. The NAND circuits 111-0 through 111-n which receive these HIGH outputs at one input thereof serve as an inverter with respect to the other input thereof.

Accordingly, if the output Pn-1 is HIGH, for example, the NAND circuit 113-n-1 outputs the input signal SI. In this case, the input signal SI propagates through the NAND circuit 111-n-1, the inverter 112-n-1, ..., the NAND circuit 111-0, and the inverter 112-0 before it is output as an output signal SO.

As a result, the delay of the output signal SO is changed depending on a position of the only one HIGH signal among the output signals P0 through Pn. When the output signal P0 is HIGH, the delay is minimum. When the output Pn is HIGH, a maximum delay is provided.

As described above, the phase-comparison circuit 20 of FIG. 3 compares edge timings between two signals, and the delay-control circuit 21 of FIG. 4 controls the delay amount of the delay circuit 22 of FIG. 5 based on the comparison results. This achieves phase adjustment of one of the two signals such that the two signals have the same edge timing. Namely, in the DLL circuits 13-1 through 13-3 of FIG. 1, the clock signal CLK, the input signal A, and the input signal B are aligned to the signal having the largest delay.

Figure 6:
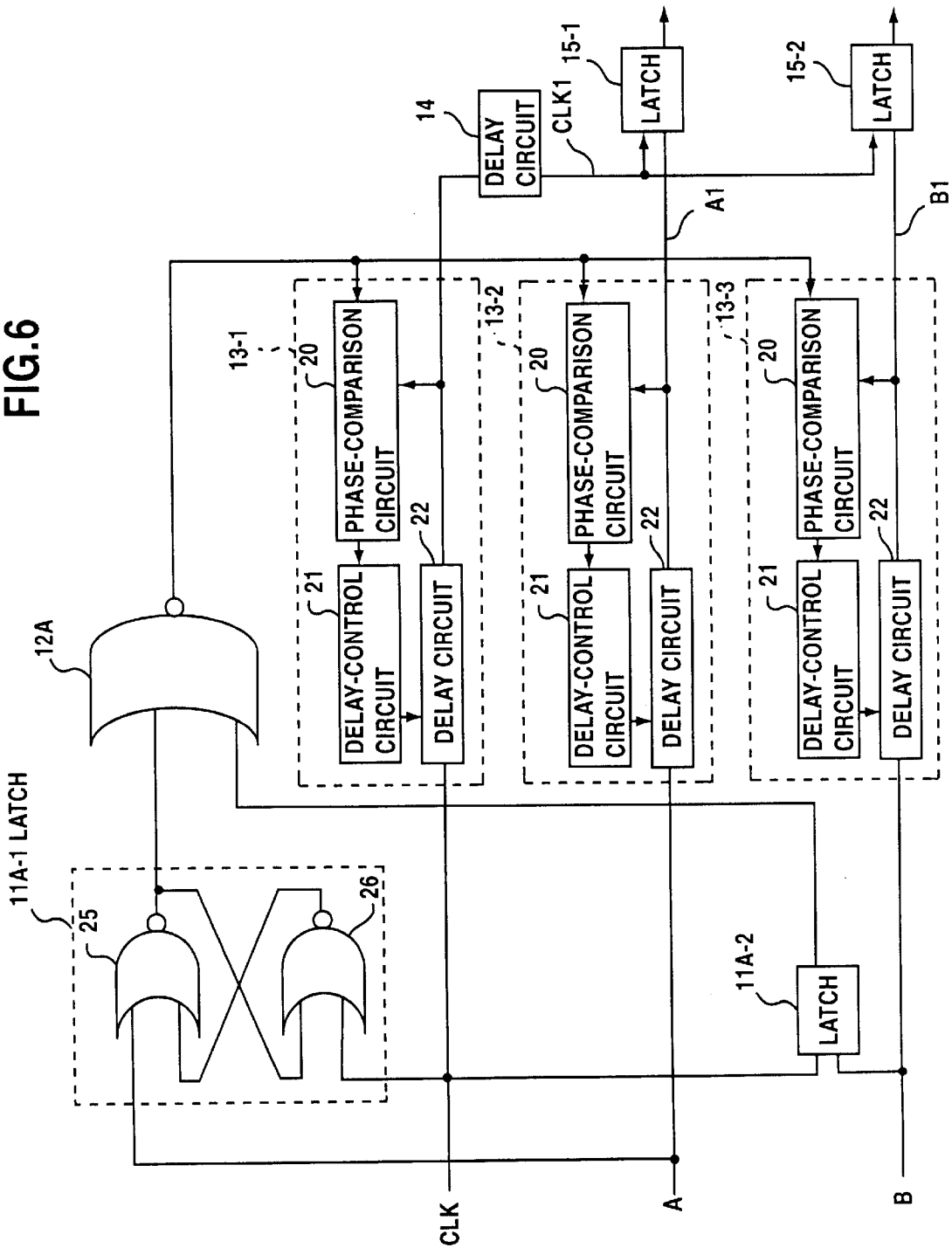
FIG. 6 is a block diagram of a signal-input circuit according to a second embodiment of the present invention.

FIG. 6 is a block diagram of a signal-input circuit according to a second embodiment of the present invention.

The signal-input circuit of FIG. 6 includes latches 11A-1 and 11A-2 and a NOR circuit 12A in place of the latches 11-1 and 11-2 and the NOR circuit 12 of FIG. 1. Each of the latches 11A-1 and 11A-2 of FIG. 6 includes NOR circuits 25 and 26.

FIGS. 7A through 7F are timing charts for explaining operations of the signal-input circuit shown in FIG. 6. With reference to FIGS. 7A through 7F, the operations of the signal-input circuit of FIG. 6 will be described.

Figure 7:
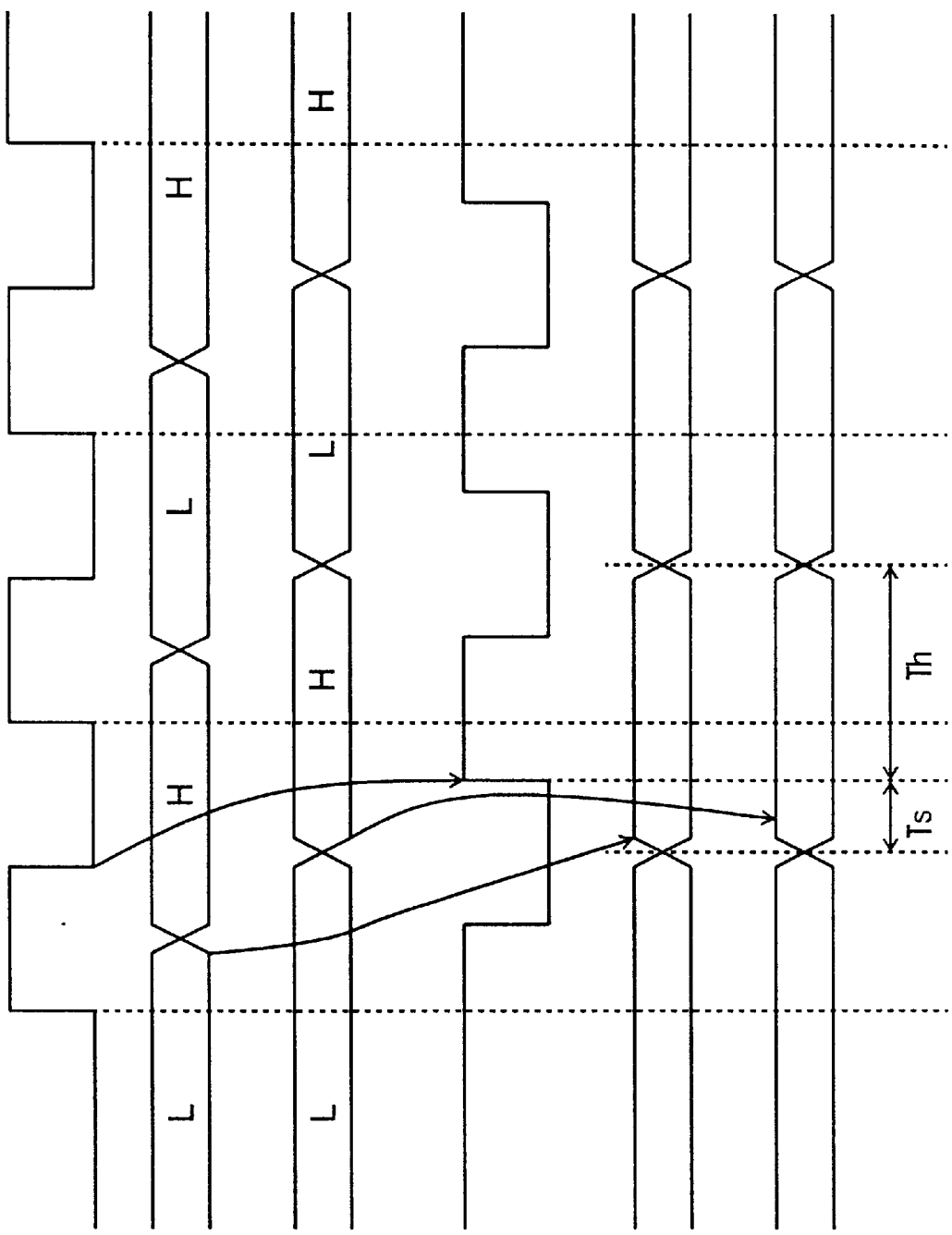
FIGS. 7A through 7F are timing charts for explaining operations of the signal-input circuit shown in FIG. 6.

As shown in FIGS. 7A through 7C, the input signals A and B have a level change thereof within one clock cycle during which the clock signal CLK changes from HIGH to LOW. The input signals A and B are supplied to the signal-input circuit at different timings because of various causes such as different lengths of signal wires, different capacitances of signal wires, different characteristics of circuits on the signal-output side, etc.

In the signal-input circuit of FIG. 6, the latches 11A-1 and 11A-2 are reset at a rising edge of the clock signal CLK, thereby supplying HIGH outputs. After the reset, the latch 11A-1 is set at a rising edge of the input signal A, thereby producing a LOW output. A rising edge of the input signal B resets the latch 11A-2, so that the output of the latch 11A-2 is changed to LOW. The outputs of the latches 11A-1 and 11A-2 are supplied to the NOR circuit 12A. The NOR circuit 12A thus outputs a HIGH signal at a timing when both the latches 11A-1 and 11A-2 are set. Accordingly, the timing at which the output of the NOR circuit 12A changes from LOW to HIGH indicates a signal-change timing of the signal which is furthest behind among the input signals A and B.

The rising edge output from the NOR circuit 12A is supplied to the DLL circuits 13-1 through 13-3. The DLL circuit 13-1 further receives the clock signal CLK, and delays the clock signal CLK for phase adjustment such that rising edges of the clock signal CLK coincide with rising edges of the output of the NOR circuit 12A. The DLL circuit 13-2 receives the input signal A, and delays the input signal A for phase adjustment such that rising edges of the input signal A are concurrent with rising edges of the output of the NOR circuit 12A. Further, the DLL circuit 13-3 receives the input signal B, and delays the input signal B for phase adjustment such that rising edges of the input signal B are concurrent with rising edges of the output of the NOR circuit 12A.

In this manner, the signal-input circuit adjusts phases of the input signals A and B by using the DLL circuits 13-2 and 13-3, respectively, and generates the delayed input signals A1 and B1, which exhibit a timing match with the input signal having the largest delay as shown in FIGS. 7E and 7F. Further, the DLL circuit 13-1 and the delay circuit 14 are used to generate the delayed clock signal CLK1, which is delayed by the setup time Ts behind the timing of the input signal having the largest delay. The delayed clock signal CLK1 is then used for latching the delayed input signals A1 and B1. In this manner, the delayed input signal A1 and B1 can be latched while maintaining an appropriate setup time Ts and an appropriate hold time Th by using the delay circuit 14.

In the first embodiment, signals changing from HIGH to LOW are input during one cycle of the clock signal. On the other hand, the second embodiment employs signals changing from LOW to HIGH during one clock cycle in order to attend to phase adjustment between the clock signal and the input signal.

Figure 8:
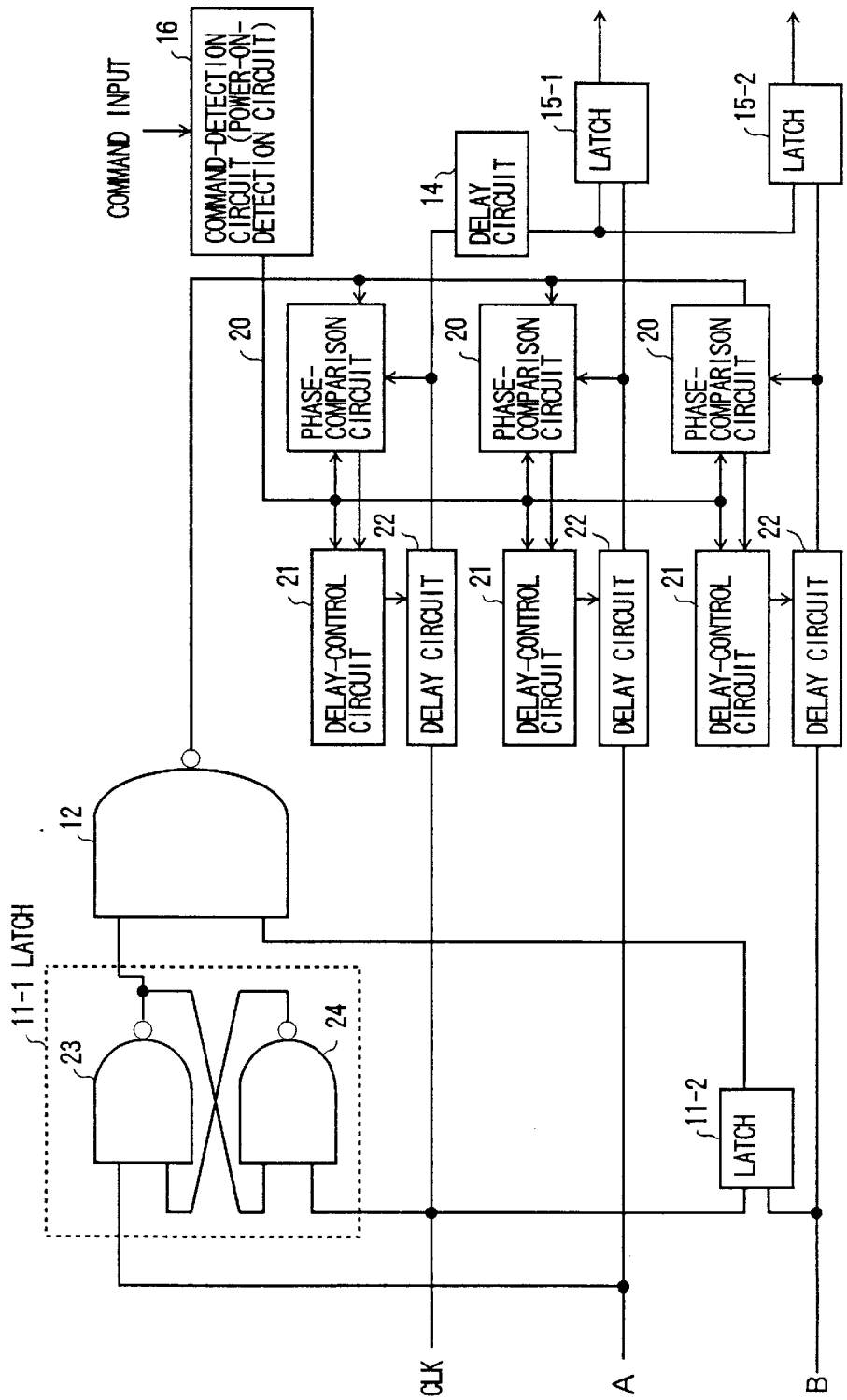
FIG. 8 is a block diagram of a signal-input circuit according to a third embodiment of the present invention.

FIG. 8 is a block diagram of a signal-input circuit according to a third embodiment of the present invention. In FIG. 8, the same elements as those of FIG. 1 are referred to by the same numerals, and a description thereof will be omitted.

The signal-input circuit of FIG. 8 is provided with a command-detection circuit 16. When a command is input from the exterior for the purpose of indicating a calibration mode, the command-detection circuit 16 activates the phase-comparison circuit 20 and the delay-control circuit 21. After this, upon receiving a command input indicating a normal operation mode, the command-detection circuit 16 stops the phase-comparison circuit 20 and the delay-control circuit 21 from operating. The command-detection circuit 16 may be implemented by employing a conventional configuration often found in conventional command decoders. Control of the phase-comparison circuit 20 and the delay-control circuit 21 with regard to the starting and stopping of the operations thereof can be implemented by controlling power supply to the circuits, for example, which is well within ordinary skill in the art. Detailed descriptions will not be provided regarding the command-detection circuit 13.

In place of the command-detection circuit 16 shown in FIG. 8, a power-on-detection circuit may be provided in order to detect the power-on of the semiconductor device. In this case, the calibration mode is defined as a predetermined time period after the detection of the power-on, and the phase-comparison circuit 20 and the delay-control circuit 21 are driven only during this predetermined time period.

Figure 9:
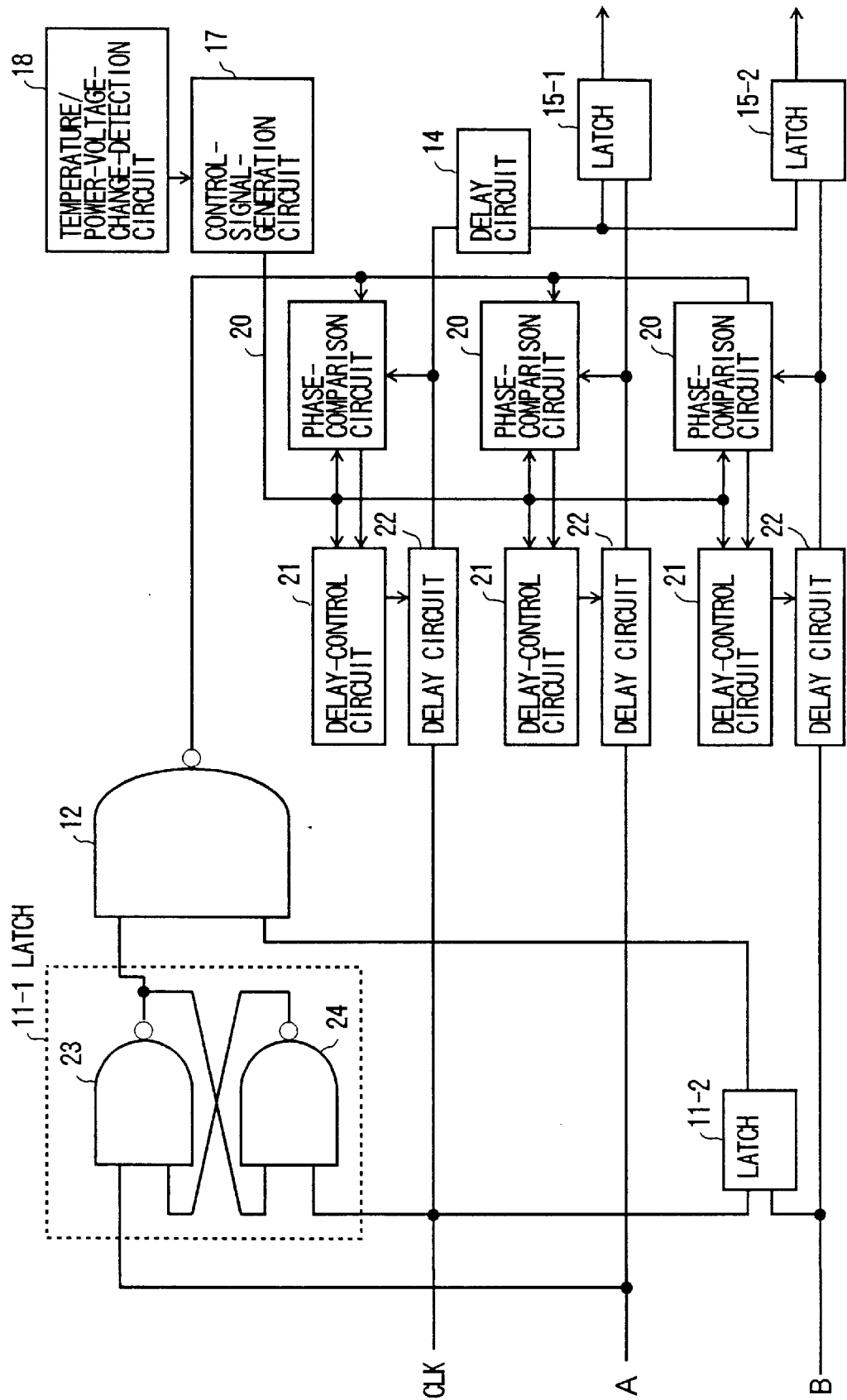
FIG. 9 is a block diagram of a signal-input circuit according to a fourth embodiment of the present invention.

FIG. 9 is a block diagram of a s:Lgnal-input circuit according to a fourth embodiment of the present invention. In FIG. 9, the same elements as those of FIG. 1 are referred to by the same numerals, and a description thereof will be omitted.

The signal-input circuit of FIG. 9 includes a control-signal-generation circuit 17 and a temperature/power-voltage-change-detection circuit 18. The temperature/power-voltage-change-detection circuit 18 monitors changes in temperature and a power voltage of the semiconductor device, and informs the control-signal-generation circuit 17 of detected changes. Upon finding the changes in temperature or the power voltage, the control-signal-generation circuit 17 changes the operation mode to a calibration mode, and activating the phase-comparison circuit 20 and the delay-control circuit 21. The control-signal-generation circuit 17 counts the number of falling edges of the output from the NAND circuit 12A. When the count number becomes a predetermined number, the calibration mode is brought to an end, and the operations of the phase-comparison circuit 20 and the delay-control circuit 21 are stopped.

When there is a change in temperature or in the power-voltage level, the delay length of the delay circuit 22 is likely to deviate from the optimum length. The configuration of FIG. 9 copes with such a situation by initiating the calibration mode automatically so as to make optimum settings again to the delay length of the delay circuit 22. In this case, the output of the temperature/power-voltage-change-detection circuit 18 is preferably sent to the exterior of the semiconductor circuit. This allows a user to learn that the calibration mode has been put in place, so that the user can provide calibration-purpose input signals for the semiconductor device.

The control-signal-generation circuit 17 can be implemented by using a simple logic circuit including a counter. Further, the temperature/power-voltage-change-detection circuit 18 can be one of the well-known circuits of this kind which detect temperature changes or voltage changes, and a description thereof will be omitted.

Further, the present invention is not limited to these embodiments, but various variations and modifications may be made without departing from the scope of the present invention.

What is claimed is:

1. A semiconductor integrated circuit receiving a plurality of input signals each exhibiting a signal-level change during a predetermined time span, said semiconductor integrated circuit comprising:

a timing-detection circuit which detects timing of said signal-level change of said input signals, and outputs which input signal is furthest behind in terms of a signal-level-change timing among said plurality of input signals within said predetermined time span;

first delay-adjustment circuits which receive and delay said plurality of input signals, respectively, in response to an output signal from the timing-detection circuit to generate delayed input signals such that signal-level-change timings of said delayed input signals are aligned to said signal-level-change timing of said furthest behind input signal; and latch circuits each latching a respective one of said delayed input signals.

2. The semiconductor integrated circuit as claimed in claim 1, further comprising:

a second delay-adjustment circuit which receives a clock signal, and delays said clock signal to align a signal-level-change timing of said clock signal to said signal-level-change timing of said furthest behind input signal; and a clock-delay circuit which further introduces a predetermined delay to said clock signal delayed by said second delay-adjustment circuit so as to generate a delayed clock signal, wherein said latch circuits use said delayed clock signal as a synchronization signal to latch said delayed input signals.

3. The semiconductor integrated circuit as claimed in claim 2, wherein each of said first delay-adjustment circuits comprises:

a signal-delay circuit which receives a respective input signal of said plurality of input signals, and delays said respective input signal by an adjusted delay amount;

a phase-comparison circuit which compares a signal-level-change timing of said respective input signal delayed by said signal-delay circuit with said signal-level-change timing of said furthest behind input signal; and a delay-control circuit which adjusts said adjusted delay amount based on comparison results of said phase-comparison circuit such that said signal-level-change timing of said respective input signal delayed by said signal-delay circuit is substantially equal to said signal-level-change timing of said furthest behind input signal.

4. The semiconductor integrated circuit as claimed in claim 2, wherein said timing-detection circuit comprises:

a plurality of latches each provided for a corresponding one of said plurality of input signals, each of said plurality of latches being set when a corresponding one of said plurality of input signals exhibits a signal-level change; and a circuit which changes an output thereof when all of said plurality of latches are set.

5. The semiconductor integrated circuit as claimed in claim 2, wherein said predetermined time span is equal to one cycle of said clock signal.

6. The semiconductor integrated circuit as claimed in claim 2, wherein said first delay-adjustment circuits and said second delay-adjustment circuit operate during a calibration mode.

7. The semiconductor integrated circuit as claimed in claim 6, further comprising a command-detection circuit which sets said calibration mode in response to a command input.

8. The semiconductor integrated circuit as claimed in claim 6, further comprising a power-on-detection circuit which sets said calibration mode upon detecting power-on of said semiconductor integrated circuit.

9. The semiconductor integrated circuit as claimed in claim 6, further comprising a detection-and-setting circuit which monitors a power voltage and temperature, and sets said calibration mode in response to a change in at least one of said power voltage and said temperature.

10. The semiconductor integrated circuit as claimed in claim 9, said detection-and-setting circuit comprises:

a detection circuit which monitors said power voltage and said temperature, and detects a change in at least one of said power voltage and said temperature; and setting circuit which sets said calibration mode when said detection circuit detects said change, and counts a number as to how many times said timing-detection circuit detects said signal-level-change timing of said furthest behind input signal, said setting circuit ending said calibration mode when said number becomes a predetermined number.

11. A semiconductor integrated circuit comprising:

a timing-detection circuit detecting and outputting an input signal which is furthest behind in terms of timings among a plurality of input signals;

a first delay-adjustment circuit which delays said plurality of input signals to generate delayed input signals such that said delayed input signals are aligned to said input signal; and latch circuits latching said delayed input signals.

12. The semiconductor integrated circuit as claimed in claim 11, further comprising:

a second delay-adjustment circuit which receives a clock signal, and delays said clock signal to align said clock signal to said input signal; and a clock-delay circuit which further introduces a predetermined delay to said clock signal delayed by said second delay-adjustment circuit so as to generate a delayed clock signal, wherein said latch circuits use said delayed clock signal as a synchronization signal to latch said delayed input signals.

* * * * *